(12) United States Patent
Chiappe et al.

(10) Patent No.: US 11,978,971 B2
(45) Date of Patent: May 7, 2024

(54) TOOLLESS INFORMATION HANDLING SYSTEM COMPRESSION ATTACHED MEMORY MODULE INSTALLATION APPARATUS, SYSTEMS, AND METHODS

(71) Applicant: Dell Products, L.P., Round Rock, TX (US)

(72) Inventors: Glenn Chiappe, Austin, TX (US); Jason Scott Morrison, Chadron, NE (US)

(73) Assignee: Dell Products, L.P., Round Rock, TX (US)

( * ) Notice: Subject to any disclaimer, the term of this patent is extended or adjusted under 35 U.S.C. 154(b) by 237 days.

(21) Appl. No.: 17/376,779

(22) Filed: Jul. 15, 2021

(65) Prior Publication Data
US 2023/0012759 A1   Jan. 19, 2023

(51) Int. Cl.
*H01R 12/70*   (2011.01)
*H05K 1/14*   (2006.01)

(52) U.S. Cl.
CPC ......... *H01R 12/7023* (2013.01); *H05K 1/141* (2013.01); *H05K 2201/10159* (2013.01)

(58) Field of Classification Search
CPC .... H05K 1/14; H05K 1/141–147; H05K 5/00; H05K 5/04; H05K 5/06; H05K 7/02; H05K 7/04; H05K 7/10; H05K 7/12; H05K 7/142; H01R 12/88–89; H01R 12/023
USPC ............. 361/752–759, 807–810; 174/138 G, 174/138 F
See application file for complete search history.

(56) References Cited

U.S. PATENT DOCUMENTS

| | | | | |
|---|---|---|---|---|
| 4,901,204 A * | 2/1990 | Hayashi | ................. | H05K 7/142 24/297 |
| 5,281,149 A * | 1/1994 | Petri | ..................... | H05K 7/142 439/74 |
| 5,917,709 A * | 6/1999 | Johnson | ................. | H01R 12/62 439/74 |
| 6,424,537 B1 * | 7/2002 | Paquin | ................... | H05K 7/142 361/752 |
| 6,545,879 B1 * | 4/2003 | Goodwin | ............. | H05K 7/1053 361/709 |
| 6,695,629 B1 * | 2/2004 | Mayer | ................... | H05K 7/142 361/752 |

(Continued)

*Primary Examiner* — Tuan T Dinh
(74) *Attorney, Agent, or Firm* — Fogarty LLP

(57) ABSTRACT

Toolless Compression Attached Memory Module (CAMM) installation systems and methods employ a bolster plate with a generally flat, parallelepiped body portion configured to contact one surface of a CAMM Printed Circuit Board (PCB) and provide compression between the CAMM and a z-axis compression connector. The bolster plate body defines (a) ramped keyhole(s), each ramped keyhole converts lateral displacement of the bolster plate into vertical displacement, providing the compression between the CAMM and the z-axis compression connector, by the ramped keyhole(s) sliding along (a) bottom face(s) of (a) head(s) of (a) fixed standoff(s) extending from an information handling system (IHS) PCB, through the z-axis compression connector and the CAMM PCB. The bolster plate may lock in place, laterally displaced, to maintain the compression between the CAMM and the z-axis compression connector. The bolster plate may also have a flange portion extending generally perpendicular from the body portion.

20 Claims, 11 Drawing Sheets

(56) References Cited

U.S. PATENT DOCUMENTS

| | | | | |
|---|---|---|---|---|
| 6,799,980 B2* | 10/2004 | Bloomfield | ............... | H01R 4/66 |
| | | | | 439/95 |
| 7,040,905 B1* | 5/2006 | Wang | ................... | H05K 7/1418 |
| | | | | 361/759 |
| 7,064,958 B2* | 6/2006 | Chen | ...................... | H05K 7/142 |
| | | | | 361/740 |
| 7,385,830 B2* | 6/2008 | Liu | ....................... | H05K 7/142 |
| | | | | 174/138 R |
| 7,539,021 B2* | 5/2009 | Peng | ....................... | H05K 9/00 |
| | | | | 361/752 |
| 7,539,026 B2* | 5/2009 | Finnerty | ................ | H05K 1/141 |
| | | | | 361/810 |
| 8,434,217 B2* | 5/2013 | Chiu | ....................... | F16B 21/09 |
| | | | | 29/757 |
| 8,929,088 B2* | 1/2015 | Ma | ......................... | H05K 7/142 |
| | | | | 361/759 |
| 10,462,910 B2* | 10/2019 | Brodbeck | ................ | H05K 1/14 |

\* cited by examiner

TOOLLESS INFORMATION HANDLING SYSTEM COMPRESSION ATTACHED MEMORY MODULE INSTALLATION APPARATUS, SYSTEMS, AND METHODS

FIELD

The present disclosure relates generally to Information Handling Systems (IHSs), and more particularly, to toolless installation Compression Attached Memory Modules (CAMMs) in IHSs.

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated.

Variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

SUMMARY

Embodiments of systems and methods for toolless Compression Attached Memory Module (CAMM) installation in Information Handling Systems (I HSs) are described. In an illustrative, non-limiting embodiment, an integral toolless-installation CAMM bolster plate has a generally flat, parallelepiped body portion configured to contact one surface of a CAMM Printed Circuit Board (PCB) and provide compression between the CAMM and a z-axis compression connector. The bolster plate body defines (a) ramped keyhole(s), each ramped keyhole converts lateral displacement of the toolless-installation CAMM bolster plate into vertical displacement, providing the compression between the CAMM and the z-axis compression connector, by the ramped keyhole(s) sliding along (a) bottom face(s) of (a) head(s) of (a) fixed standoff(s) extending from an IHS PCB, through the z-axis compression connector and the CAMM PCB. The bottom face(s) of the head(s) of the fixed standoff(s) may be angled at a chamfer matching a chamfer in the key-hole ramp(s).

The integral toolless-installation CAMM bolster plate may lock in place, laterally displaced, to maintain the compression between the CAMM and the z-axis compression connector. The integral toolless-installation CAMM bolster plate may also have a flange portion extending generally perpendicular from the body portion. This flange portion may be positioned to be disposed over an end edge of the CAMM PCB. The toolless-installation CAMM bolster plate may also include a dielectric insulating material having a low coefficient of friction disposed on a bottom surface of the bolster plate body portion, to contact the surface of the CAMM PCB.

The integral toolless-installation CAMM bolster plate may be configured to receive the head of each standoff through a first end of each ramped keyhole and be moved laterally along the CAMM PCB to engage the head of each standoff with each ramped keyhole to provide increasing vertical pressure to the one surface of the CAMM PCB, to in turn, provide the compression between the CAMM and the z-axis compression connector. The toolless-installation CAMM bolster plate may then lock in place, with the head of each standoff maintained in a second end of each ramped keyhole, opposite the first end, to maintain the compression between the CAMM and the z-axis compression connector.

Particularly, the toolless-installation CAMM bolster plate keyholes may each have sidewall portions defining a width of the keyhole sufficient to receive the head of the standoff extending from the IHS PCB, with this width narrow enough to laterally retain the head of the standoff. A deep end portion of the keyhole may be defined between the side wall portions and may define a shallow opening through the bolster plate body of a width sufficient to receive the head of the standoff. The ramp portion may be defined between the side wall portions, extending from the deep end portion to a shallow end portion of the keyhole. This shallow end portion of the keyhole may also be defined between the side wall portions, and the ramp portion may define a central slot through the bolster plate body, contiguous with the shallow opening and a deep opening defined in the shallow end portion. The slot may have a width sufficient to receive a shaft of the standoff, but narrower than the head of the standoff. Also, the shallow end portion of the keyhole may define a generally flat portion, between the side wall portions. The deep opening may also extend through the bolster plate body and have a width sufficient to receive the shaft of the standoff, but narrower than the width of the head of the standoff. The integral toolless-installation CAMM bolster plate is thereby configured to receive the head of the standoff through the shallow opening, be moved laterally along the CAMM PCB to engage the head of fastener with the ramp portion and provide increasing vertical pressure to the one surface of the CAMM PCB to provide the compression between the CAMM and the z-axis compression connector. The integral toolless-installation CAMM bolster plate may then lock in place with the head of the standoff maintained in the shallow end portion by the generally flat portion to maintain the compression between the CAMM and the z-axis compression connector. For example, the flat portion of the shallow end of each keyhole may be angled obliquely away from the ramp portion to receive the head of the standoff and lock the toolless-installation CAMM bolster plate in place and maintain the compression between the CAMM and the z-axis compression connector.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

DETAILED DESCRIPTION

Figure 1:
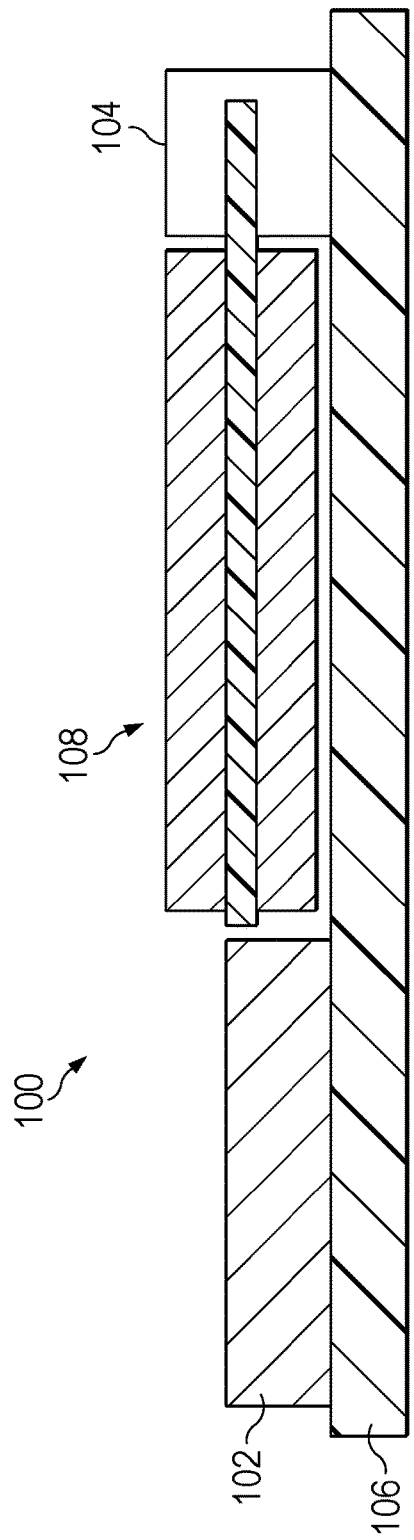
FIG. 1 is a fragmented, generally cross-sectional, diagrammatic illustration of a prior art Information Handling System (IHS), showing use of a Small Outline Dual In-Line Memory Module (SODIMM)

FIG. 1 is a fragmented, generally cross-sectional, diagrammatic block side view illustration of prior art IHS 100.

IHS 100 includes a processor, such as a CPU 102, and one or more Small Outline Dual In-Line Memory Module (SODIMM) connectors 104 assembled onto Printed Circuit Board (PCB) 106. FIG. 1 shows SODIMM module 108 retained in SODIMM. connector 104.

Double Data Rate 5 (DDR5) IHS memory may typically use the long-time industry standard SODIMM form factor. Embodiments of the present systems and methods employ Compression Attached Memory Modules (CAMMs) that affix to the motherboard of a computer system via a connector that replaces the previously used SODIMM connector. Some CAMM implementations may use screws, nuts or other threaded fasteners to attach a top bolster plate to a bottom bolster plate, or the like, and apply compression force to deflect spring contacts in a CAMM connector between the CAMM and the system PCB to compressively couple the CAMM to the PCB. However, one convenience that the SODIMM connector provides is that the memory module can be installed and uninstalled into the computer system without the use of any tools.

Embodiments of the present systems and methods employ toolless installation bolster plate to apply compression force to deflect spring contacts in the CAMM connector between the CAMM and the system PCB to compressively couple the CAMM to the PCB. Thereby, CAMM maintains a toolless latching mechanism which allows a user, technician, etc. to install and uninstall the CAMM without the use of any tools, while still generating sufficient compression force against the CAMM connector to maintain good signal integrity, while maintaining a small space envelope.

Accordingly, using systems and methods described herein, an IHS (e.g., a handheld device, laptop, etc.) may employ an integral toolless-installation CAMM bolster plate that has a generally flat, parallelepiped body portion configured to contact one surface of a CAMM Printed Circuit Board (PCB) and provide compression between the CAMM and a z-axis compression connector. The bolster plate body defines (a) ramped keyhole(s), each ramped keyhole converts lateral displacement of the toolless-installation CAMM bolster plate into vertical displacement, providing the compression between the CAMM and the z-axis compression connector, by the ramped keyhole(s) sliding along (a) bottom face(s) of (a) head(s) of (a) fixed standoff(s) extending from an information handling system (IHS) PCB, through the z-axis compression connector and the CAMM PCB. The integral toolless-installation CAMM bolster plate may lock in place, laterally displaced, to maintain the compression between the CAMM and the z-axis compression connector. The integral toolless-installation CAMM bolster plate may also have a flange portion extending generally perpendicular from the body portion.

Figure 2:
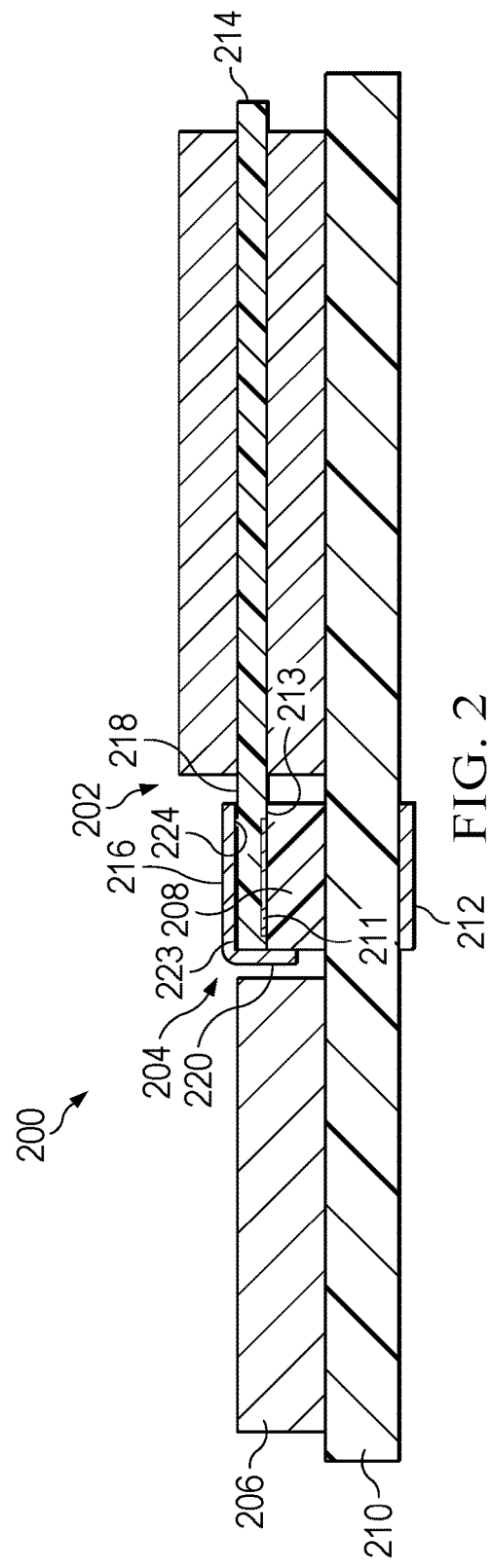
FIG. 2 is a fragmented, generally cross-sectional, diagrammatic illustration of an IHS, showing use of a Compression Attached Memory Module (CAMM), according to some embodiments of the present systems and methods.
Figure 3:
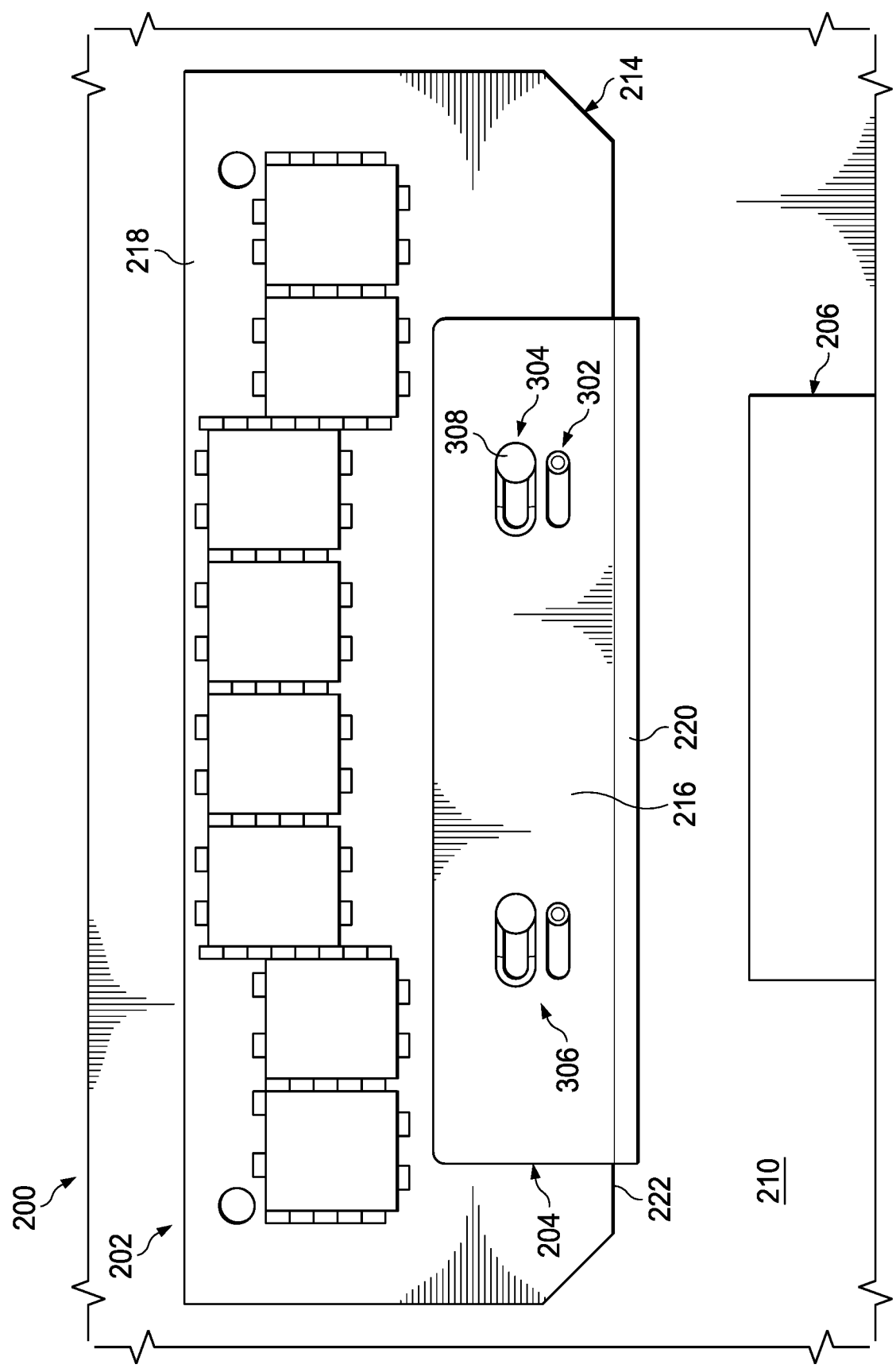
FIG. 3 is a fragmented diagrammatic top view of an IHS, showing initial installation of a CAMM using a toolless installation CAMM bolster plate, according to some embodiments of the present systems and methods.
Figure 4:
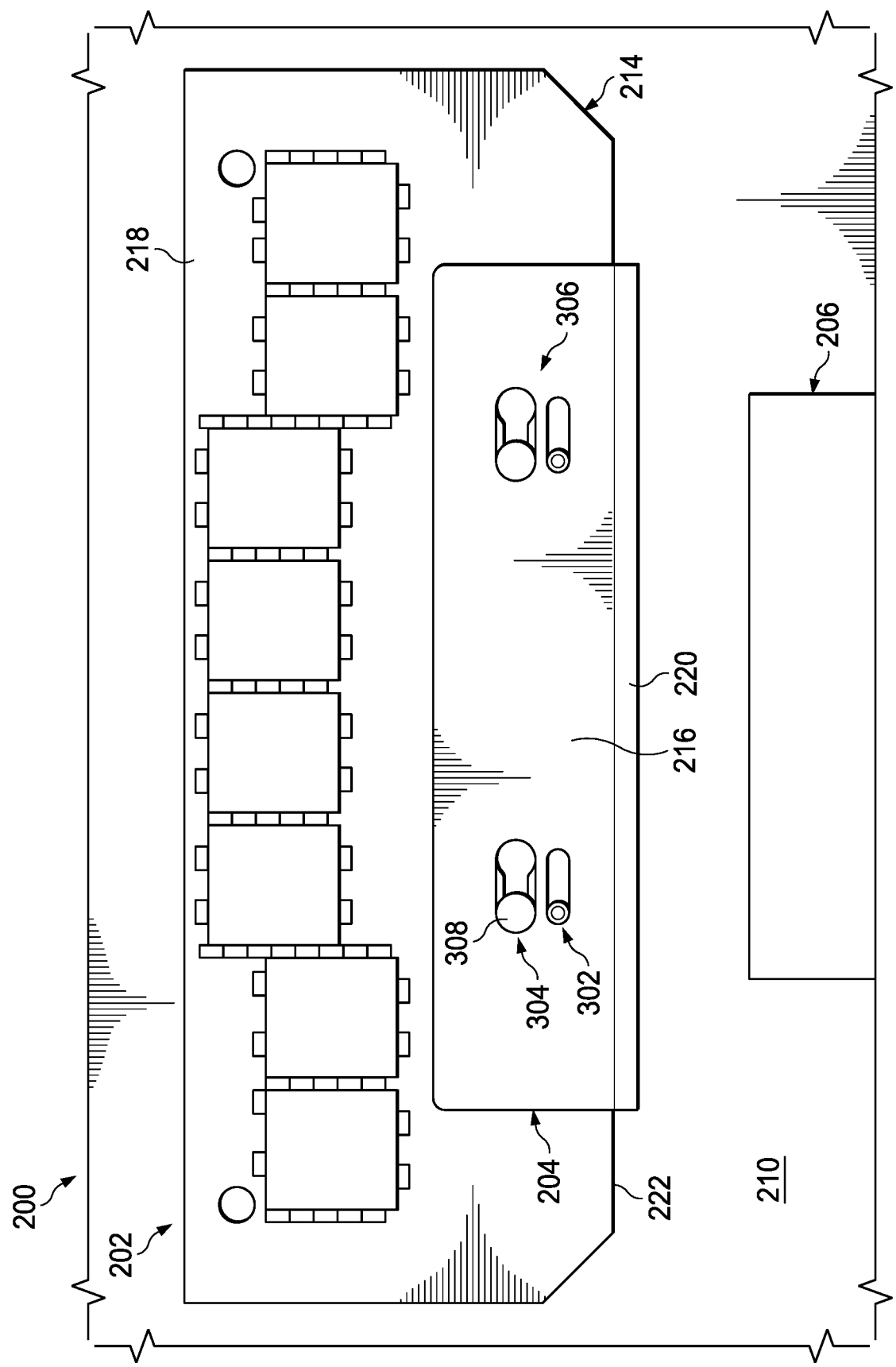
FIG. 4 is a fragmented diagrammatic top view of the IHS of FIG. 3, showing completed installation of the CAMM using the toolless installation CAMM bolster plate, according to some embodiments of the present systems and methods.

FIG. 2 is a fragmented, generally cross-sectional, diagrammatic illustration of IHS 200, showing use of CAMM 202, according to some embodiments of the present systems and methods. FIG. 3 is a fragmented diagrammatic top view of IHS 200, showing initial installation of CAMM 202 using toolless installation CAMM bolster plate 204, according to some embodiments of the present systems and methods, and FIG. 4 a is a fragmented diagrammatic top view of IHS 200, showing completed installation of CAMM 202 using toolless installation CAMM bolster plate 204, according to some embodiments of the present systems and methods. IHS 200 includes a processor, CPU 206, and a CAMM compression connector 208 assembled onto an IHS system PCB 210. Compression connector 208 is populated with CAMM 202. Compression connector 208 may be a z-axis, or "vertical," compression connector that provides connection interface to, and stand-off from, system PCB 210. Compression connector 208 may include separate contact elements on a top surface of the compression connector, one for each signal line and power line. CAMM 202 includes an array of surface contact connections 211 defined in, such as in bottom surface 213 of, CAMM PCB 214. These CAMM contacts are pressed to engage with the contact elements of compression connector 208. Examples of compression connectors may include interposers, such as, cStack or mezzanine-type connectors from Amphenol, PCBeam connectors from Neoconix, or the like. CAMM 202 may be accessed by CPU 206 via both a first memory channel and a second memory channel through compression connector 208. In some embodiments, CAMM 202 may be accessed by CPU 206 via only one of the first memory channel or a second memory channel. Compression connector 208 includes contact elements associated with both memory channels. Compression connector 208, CAMM 202, and/or system PCB 210 may include one or more complementary alignment mechanisms 302, as shown in FIGS. 3 and 4, that ensure the proper alignment of the CAMM to the compression connector and/or system PCB 210. In some embodiments, connector 208 is surface-mount-attached (soldered) to a surface of system PCB 210, and CAMM 202 is removable. In various other embodiments, connector 208 is an interposer, or the like, and includes additional contact elements on a bottom surface, that is, the surface adjacent to system PCB 210, and both the connector and CAMM 202 are removable. In such embodiments, system PCB 210 will include surface contact elements on a surface of system PCB 210 that engage with the contact elements on the bottom side of interposer connector 208.

Attachment of CAMM 202 to connector 208 may employ backing plate 212 attached at a bottom side of system PCB 210 and bolster 204 placed on top of CAMM 202 (e.g., CAMM PCB 214). CAMM backing plate 212 and bolster plate 204 provide mechanical support for necessary compression forces. To wit, contact connections of connector 208 are brought into firm contact with surface contact connections 211 of CAMM 202 (i.e., CAMM PCB 214) by bolster 204 tightening against CAMM 202 (i.e., CAMM PCB 214) such as, in accordance with embodiments of the present systems and methods, lateral displacement of using toolless installation CAMM bolster plate 204, as shown in FIGS. 3 and 4. Therein, integral toolless-installation CAMM top bolster plate 204 has a generally flat parallelepiped body portion 216 configured to contact top surface 218 of CAMM PCB 214 and provide compression between CAMM 202 and a z-axis compression connector 208. In accordance with embodiments of the present systems and methods, top bolster plate body 216 may define at least one ramped keyhole 306. Each ramped keyhole, in accordance with the present systems and methods, converts lateral displacement of toolless-installation CAMM top bolster plate 204 across CAMM PCB 214, such as shown between FIGS. 3 and 4, into vertical displacement, providing compression between CAMM 204 and the z-axis compression connector 208. This compression is provided by the ramped keyhole(s) sliding along (a) bottom face(s) of head 310 of fixed standoff(s) 304, or similar fastener, extending from system PCB 210, through z-axis compression connector 208 and CAMM PCB 214. In accordance with embodiments of the present systems and methods, toolless-installation CAMM top bolster plate 204 is configured to lock in place, laterally displaced, as shown in FIG. 4, to maintain the compression between CAMM 204 and z-axis compression connector 208.

In some embodiments, toolless installation CAMM bolster plate 204 may be fashioned as a flanged, L-shaped, member, as illustrated, to provide additional stiffness to the bolster to facilitate later installation described above, as well as to evenly maintain compression across the surface of CAMM 202 (i.e., CAMM PCB 214) and/or connector 208 (once installed). Therefore, toolless-installation CAMM top bolster plate 204 may include flange portion 220 extending generally perpendicular from body portion 216. Flange portion 220 may be positioned so as to be disposed over end edge 222 of CAMM PCB 214. Also, in accordance with various embodiments of the present systems and methods, bolster plate materials may be selected to ensure such stiffness. Therefore, in accordance with embodiments of the present systems and methods, toolless installation CAMM bolster plate 204 may be made of metal, such as, a stainless steel, (an) aluminum (alloy), or the like. Likewise, standoff(s) 304 may be made of the same, or other metal, such as stainless steel, copper, brass, etc. Whereas toolless installation CAMM bolster plate 204 and standoff(s) 304 may be made from a metal that is electrically conductive, to provide electrical conductivity to the ground plane of system PCB 210, toolless installation CAMM bolster plate 204 may be made of a non-electrically conductive metal (or other material, such as a rigid plastic) such as to avoid unintentional arcing, static discharge, or the like during installation and/or removal of CAMM 202. In further accordance with some embodiments of the present systems and methods, dielectric insulating material 223 may be disposed on bottom surface 224 of top bolster plate body portion 216 to contact surface 218 of CAMM PCB 214. This dielectric insulating material, may, in accordance with embodiments of the present systems and methods, has a low coefficient of friction, such as less than 0.01. For example, the dielectric insulating material may be Teflon (coefficient of friction of steel on Teflon: 0.04), Mylar (coefficient of friction of steel on mylar: −0.2), or the like.

Figure 5:
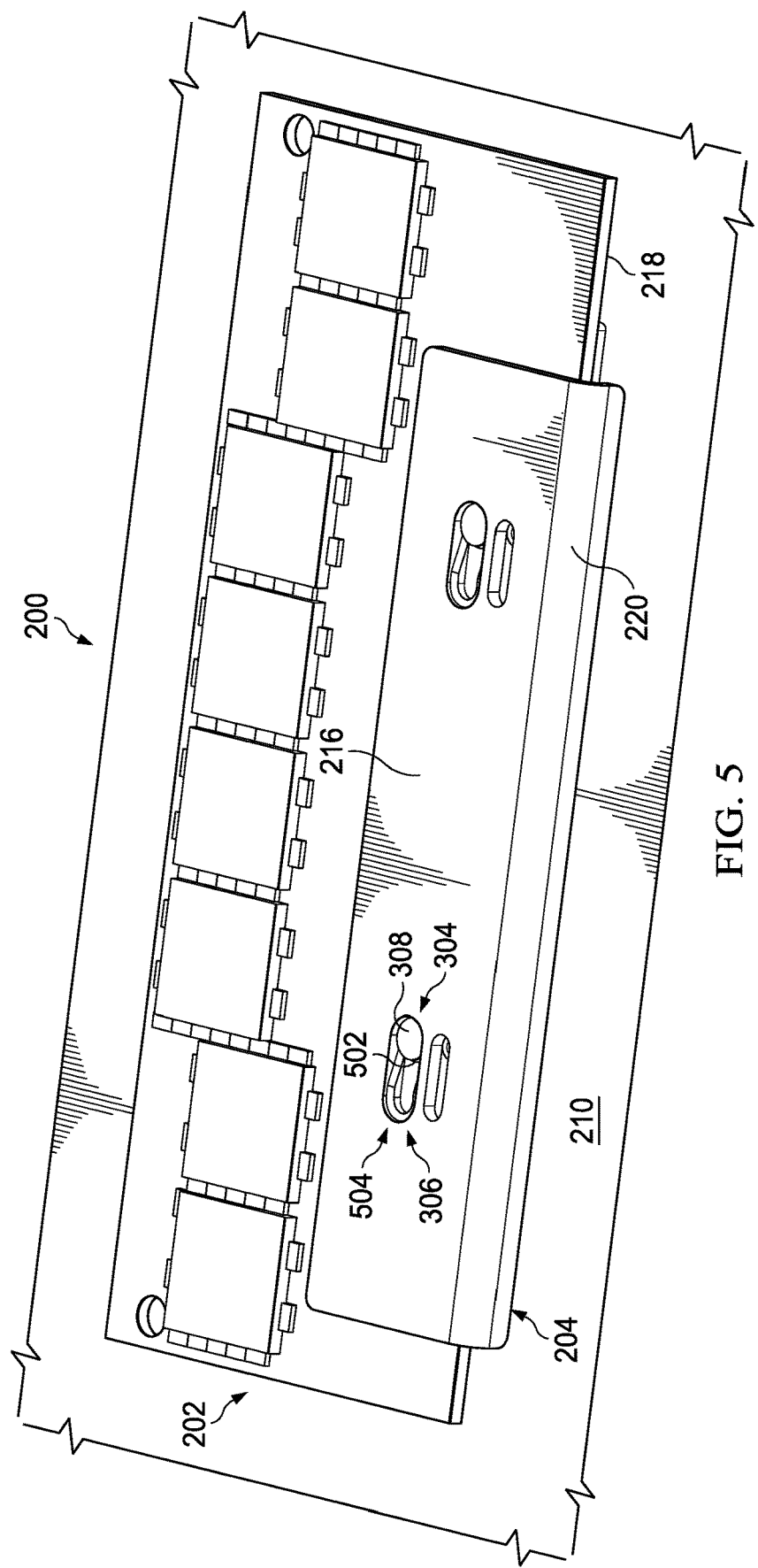
FIG. 5 is a fragmented diagrammatic isometric view of an IHS, showing initial installation of a CAMM using a toolless installation CAMM bolster plate and the ramped keyholes of the toolless installation CAMM bolster plate, according to some embodiments of the present systems and methods.

FIG. 5 is a fragmented diagrammatic isometric view of IHS 200, showing initial installation of CAMM 202 using toolless installation CAMM top bolster plate 204 and the ramped keyholes 304 of the toolless installation CAMM top bolster plate, according to some embodiments of the present systems and methods. Toolless-installation CAMM top bolster plate 204 is adapted to receive head 308 of each standoff 304, or similar fastener, through a first end 502 of each ramped keyhole 306, as shown. After which, toolless-installation CAMM top bolster plate 204 is moved laterally along CAMM PCB 214 to engage head 308 of each standoff 304 with each ramped keyhole 306 and provide increasing vertical pressure to surface 218 of CAMM PCB 214 to provide the compression between CAMM 202 and z-axis compression connector 208. As noted, toolless-installation CAMM top bolster plate 204 then locks in place with head 308 of each standoff 304 maintained in second end 504 of each ramped keyhole 306, opposite first keyhole end 502, to maintain the compression between CAMM 202 and z-axis compression connector 208.

Figure 6:
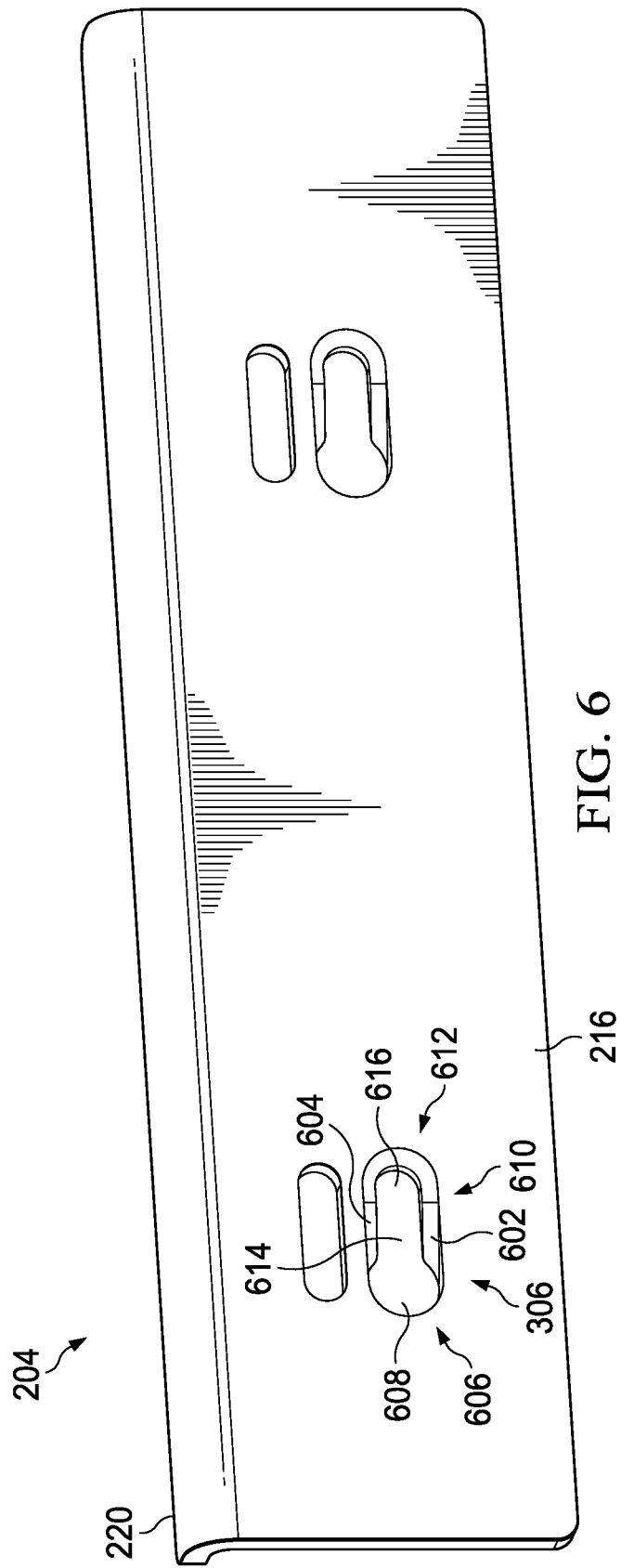
FIG. 6 is an isometric view of a toolless installation CAMM bolster plate, showing the ramped keyholes, according to some embodiments of the present systems and methods.
Figure 7:
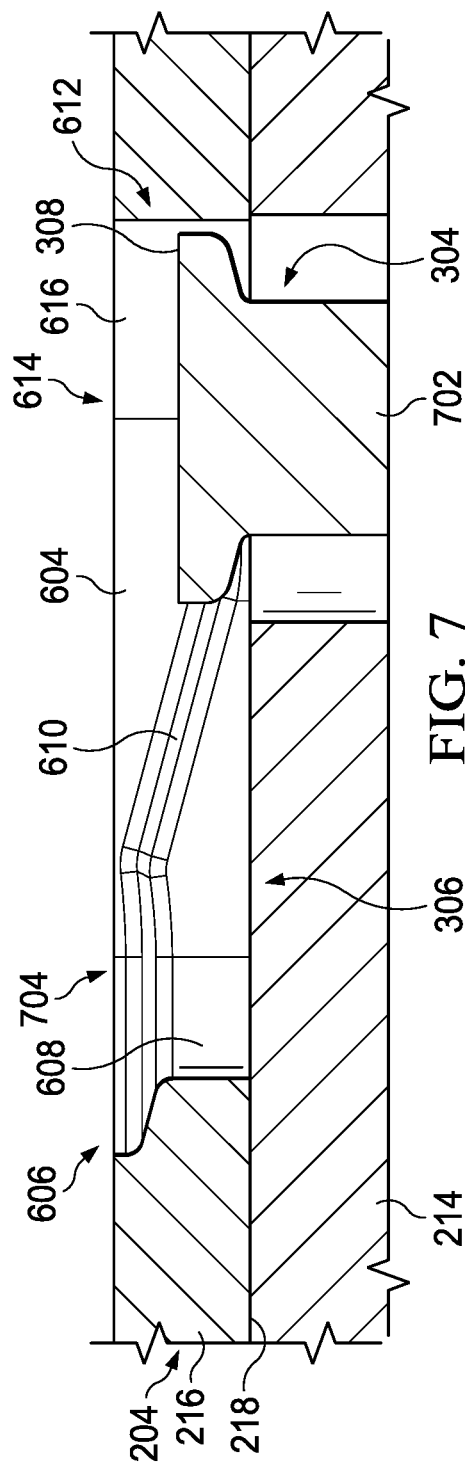
FIG. 7 is an enlarged, fragmented, generally cross-sectional, diagrammatic side view of an IHS, showing initial installation of a CAMM using a toolless installation CAMM bolster plate, according to some embodiments of the present systems and methods.
Figure 8:
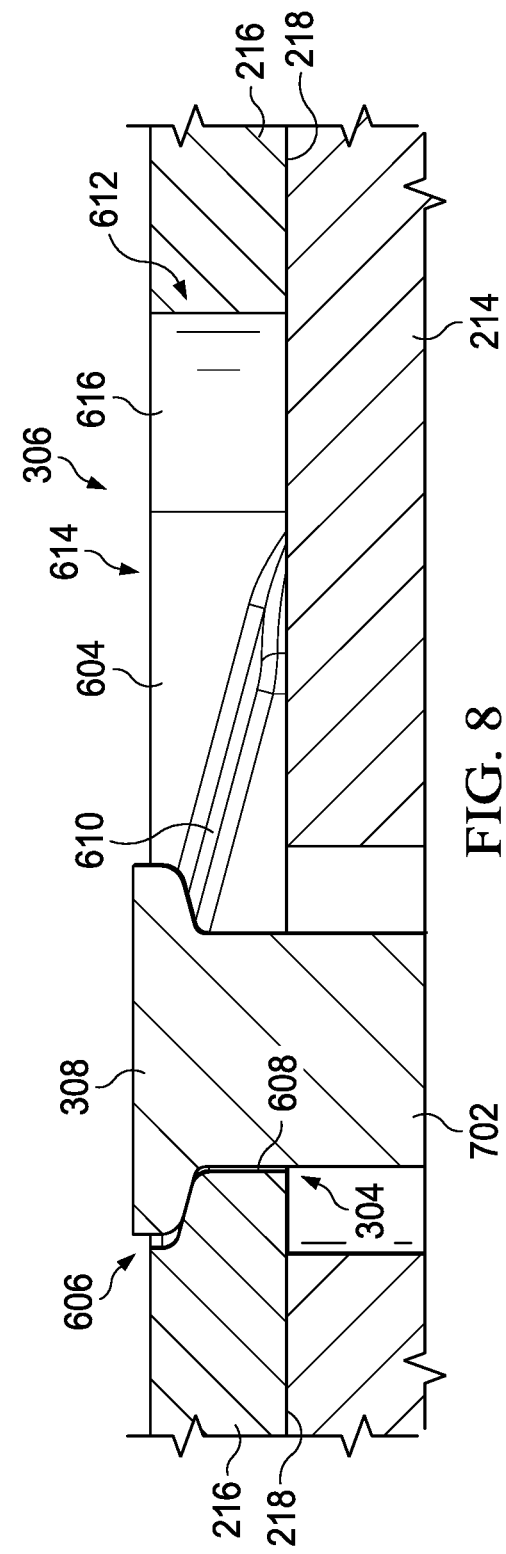
FIG. 8 is an enlarged, fragmented, generally cross-sectional, diagrammatic side view of an IHS, showing completed installation of the CAMM using the toolless installation CAMM bolster plate, according to some embodiments of the present systems and methods.
Figure 9:
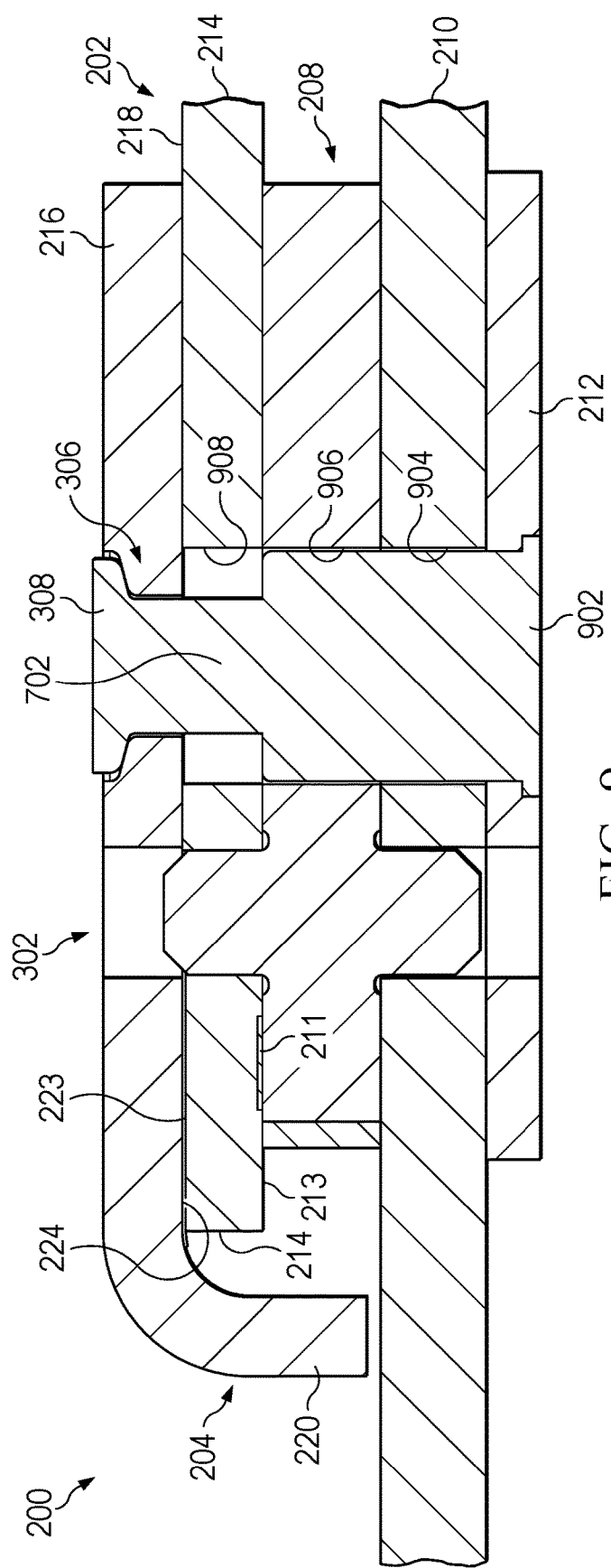
FIG. 9 is an enlarged, fragmented, generally cross-sectional, diagrammatic end view of an IHS, showing completed installation of the CAMM using the toolless installation CAMM bolster plate, according to some embodiments of the present systems and methods.
Figure 10:
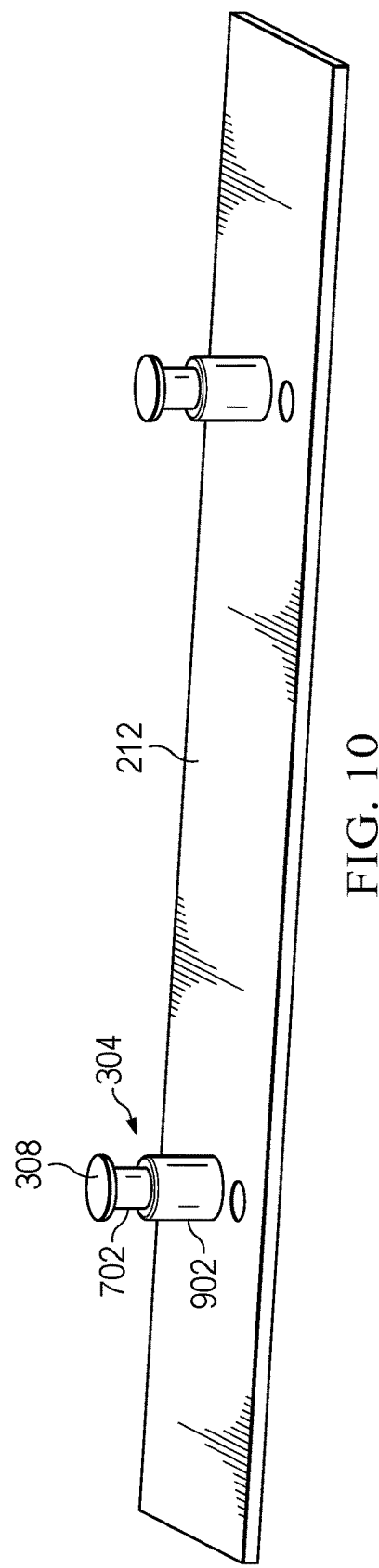
FIG. 10 is a fragmented diagrammatic isometric view of an IHS bottom bolster plate showing standoffs mounted thereon and adapted for use in conjunction with the present toolless installation CAMM top bolster plate, according to some embodiments of the present systems and methods.

FIG. 6 is an isometric view of toolless installation CAMM top bolster plate 204, showing ramped keyholes 306, according to some embodiments of the present systems and methods. FIG. 7 is an enlarged, fragmented, generally cross-sectional, diagrammatic side view of IHS 200, showing initial installation of CAMM 202 using toolless installation CAMM bolster plate 204, according to some embodiments of the present systems and methods. FIG. 9 is an enlarged, fragmented, generally cross-sectional, diagrammatic side view of IHS 200, showing completed installation of CAMM 202 using toolless installation CAMM bolster plate 204, according to some embodiments of the present systems and methods. FIG. 10 is an enlarged, fragmented, generally cross-sectional, diagrammatic end view of IHS 200, showing completed installation of CAMM 202 using toolless installation CAMM bolster plate 204, according to some embodiments of the present systems and methods. As shown in these various Figs., each toolless-installation CAMM top bolster plate keyhole 306 has sidewall portions 602 and 604 defining an overall width of keyhole 306. This overall width is sufficient to receive head 308 of standoff 304 extending from the IHS PCB. However, this overall width is also narrow enough to laterally retain the head of the standoff. That is, the overall width of each keyhole is only slightly larger than the width (diameter) of the standoff head, overall.

Deep end portion 606 of keyhole 306 is defined between side wall portions 602 and 604. This deep end portion defines shallow opening 608 through top bolster plate body 216 of a width sufficient to receive head 308 of standoff 304, such as shown in FIGS. 3, 5 and 7. Ramp portion 610 of keyhole 306 is defined between side wall portions 602 and 604, extending from deep end portion 606 to shallow end portion 612 of the keyhole. Shallow end portion 612 of keyhole 306 is also defined between side wall portions 602 and 604. Ramp portion 610 defines central slot 614 through top bolster plate body 216, contiguous with shallow opening 608 and deep opening 616 defined in shallow end portion 612. Slot 614 defines a width sufficient to receive (upper) shaft 702 of standoff 304. As can be seen in FIGS. 7 through 10, the (upper) shaft of the standoff is narrower than head 308 of the standoff, and the slot width narrower than the head of the standoff. Shallow end portion 612 of keyhole 306 defines a generally (relatively) flat portion, compared to the ramp portion. Shallow end portion 612 of keyhole 306 is also defined between side wall portions 602 and 604, with the deep opening 616 extending through top bolster plate body 216. Deep opening 616 is also of a width sufficient to receive shaft 702 of standoff 304, but narrower than a width of head 308 of the standoff.

In accordance with such embodiments of the present systems and methods, integral toolless-installation CAMM top bolster plate 204 receives head 308 of standoff 304 through shallow opening 608 and is moved laterally along surface 218 of CAMM PCB 214 to engage head 308 of standoff 304 with slotted ramp portion 610 to provide increasing vertical pressure against surface 218 of CAMM PCB 214 to, in turn provide compression between CAMM 202 and z-axis compression connector 208. Then, as shown in FIG. 4, but particularly FIGS. 8 and 9, Toolless-installation CAMM top bolster plate 204 locks in place, with head 308 of standoff 304 maintained in shallow end portion 612, by generally flat portion 704, to maintain the compression between CAMM 202 and the z-axis compression connector 208. However, as shown in FIG. 7, flat portion 704 of shallow end portion 612 of each keyhole may, in accordance with embodiments of the present systems and methods, be angled obliquely away from ramp portion 610 to receive head 308 of standoff 304 and lock toolless-installation CAMM top bolster plate 204 in place (e.g., snap-fit lock in place) and maintain the compression between CAMM 202 and z-axis compression connector 208.

FIG. 10 is a fragmented diagrammatic isometric view of an IHS bottom bolster plate 212, showing standoffs 304 mounted thereon. This bottom bolster plate is adapted for use in conjunction with present toolless installation CAMM top bolster plate 204, according to some embodiments of the present systems and methods. Bottom bolster plate 212 is, as shown in FIG. 2, adapted to be disposed under system PCB 210, standoffs 304 affixed to bottom plate 212, such as being sinched thereto, extend, from bottom plate 210 through system PCB 210, in accordance with embodiments of the present systems and methods, as best seen in FIG. 9. In accordance with embodiments of the present systems and methods, upper shaft 702 of each standoff 304 is sized to match with slot 614 of keyhole 306. However, lower shaft 902 may be sized to match standoff head 308, such as in order to correspond with the size of openings 904 and 906 in system PCB 210 and z-axis connector (interposer) 208, respectively, as shown in FIG. 9. CAMM PCB may have similarly sized opening 908. Openings 904, 906 and 908 are so sized to allow passage of standoff head 308, therethrough, during assembly and or CAMM installation.

Figure 11:
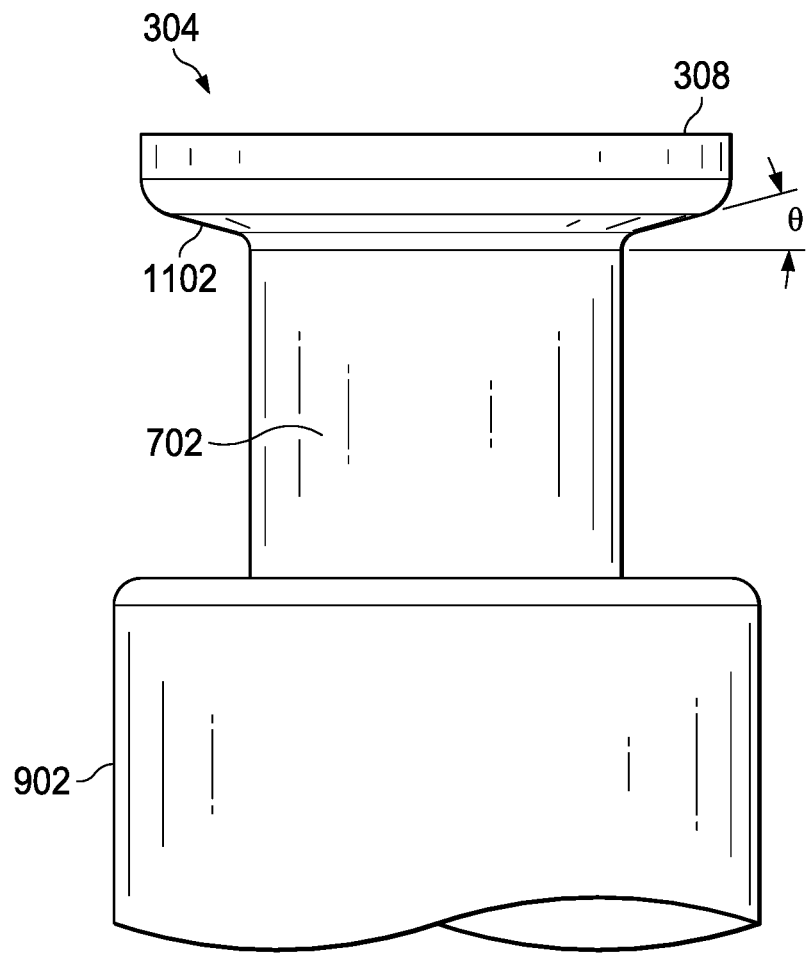
FIG. 11 is an enlarged view of the head portion of a standoff adapted for use in conjunction with the present toolless installation CAMM bolster plate, showing the angle of angled bottom face of the standoff head, according to some embodiments of the present systems and methods.
Figure 12:
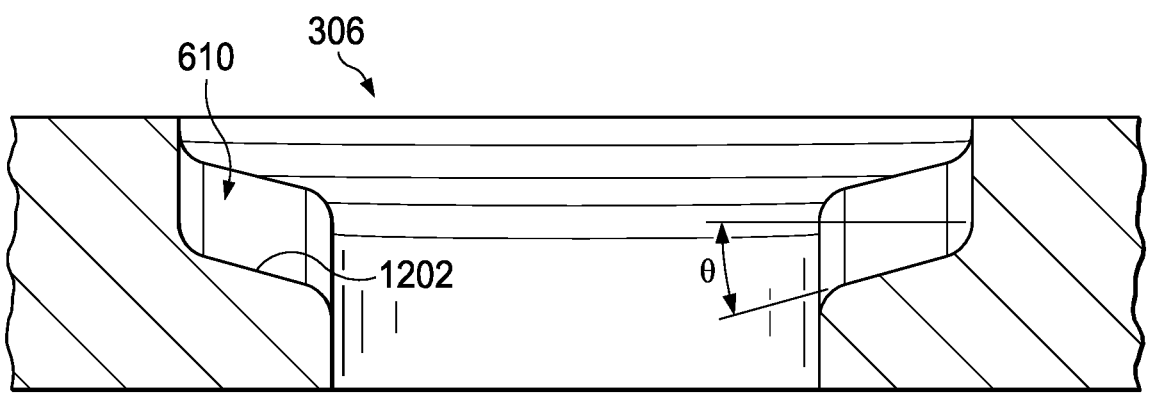
FIG. 12 is an enlarged, fragmented, generally cross-sectional, diagrammatic end view of a ramped keyhole of the present toolless installation CAMM bolster plate, showing the angle of angled top face of the keyhole ramp, corresponding with the angle of the angled bottom face of the standoff head of FIG. 11, according to some embodiments of the present systems and methods.

FIG. 11 is an enlarged view of head portion 308 of standoff 304 adapted for use in conjunction with present toolless installation CAMM bolster plate 204, showing the angle of angled bottom face 1102 of standoff head 308, according to some embodiments of the present systems and methods. FIG. 12 is an enlarged, fragmented, generally cross-sectional, diagrammatic end view of ramped keyhole 306 of present toolless installation CAMM bolster plate 204, showing the angle of angled top face 1202 of ramp 610 corresponding with the angle angled bottom face 1102 of standoff head 308 of FIG. 11, according to these embodiments of the present systems and methods. As best seen in FIGS. 9, 11 and 12 bottom face 1102 of head 308 of fixed standoff 304 is angled at chamfer (Ø°) matching chamfer (Ø°) in keyhole ramp 610.

Thereby, in accordance with embodiments of the present systems and methods, toolless installation of a CAMM in an IHS may include disposing the CAMM in the IHS, with an array of surface contact connections of the CAMM aligned with associated contact elements of a z-axis compression connector. The toolless-installation top bolster plate is then disposed on a top surface of the CAMM' PCB, in contact with the top surface of the CAMM PCB and over the z-axis compression connector. A head of a standoff extending from a system PCB of the IHS, received through an opening in the CAMM PCB, is received in a first, wider, thinner end of a ramped keyhole defined in the toolless-installation top bolster plate. The toolless-installation top bolster plate is then laterally displaced the along the CAMM PCB, with the head of the standoff in the first end of the ramped keyhole, engaging the received head of the standoff with a narrower, ramped, steepening portion of the keyhole, thereby providing increasing vertical pressure to one surface of the CAMM PCB. This presses the array of CAMM surface contact connections into contact with the associated contact elements of the z-axis compression connector, and compresses the z-axis compression connector, providing compression between the CAMM contacts and the z-axis compression connector contacts. The toolless-installation top bolster plate locks in place, laterally displaced, with the head of the standoff maintained in a second, narrower, end of the ramped keyhole, opposite the first end and angled obliquely away from the ramped portion of the keyhole. Whereby, the compressing of the z-axis compression connector locks (e.g., snap-fit locks) the toolless-installation top bolster plate in place, laterally displaced, maintaining the compression of the z-axis compression connector and the compression between the CAMM contacts and the z-axis compression connector contacts.

Figure 13:
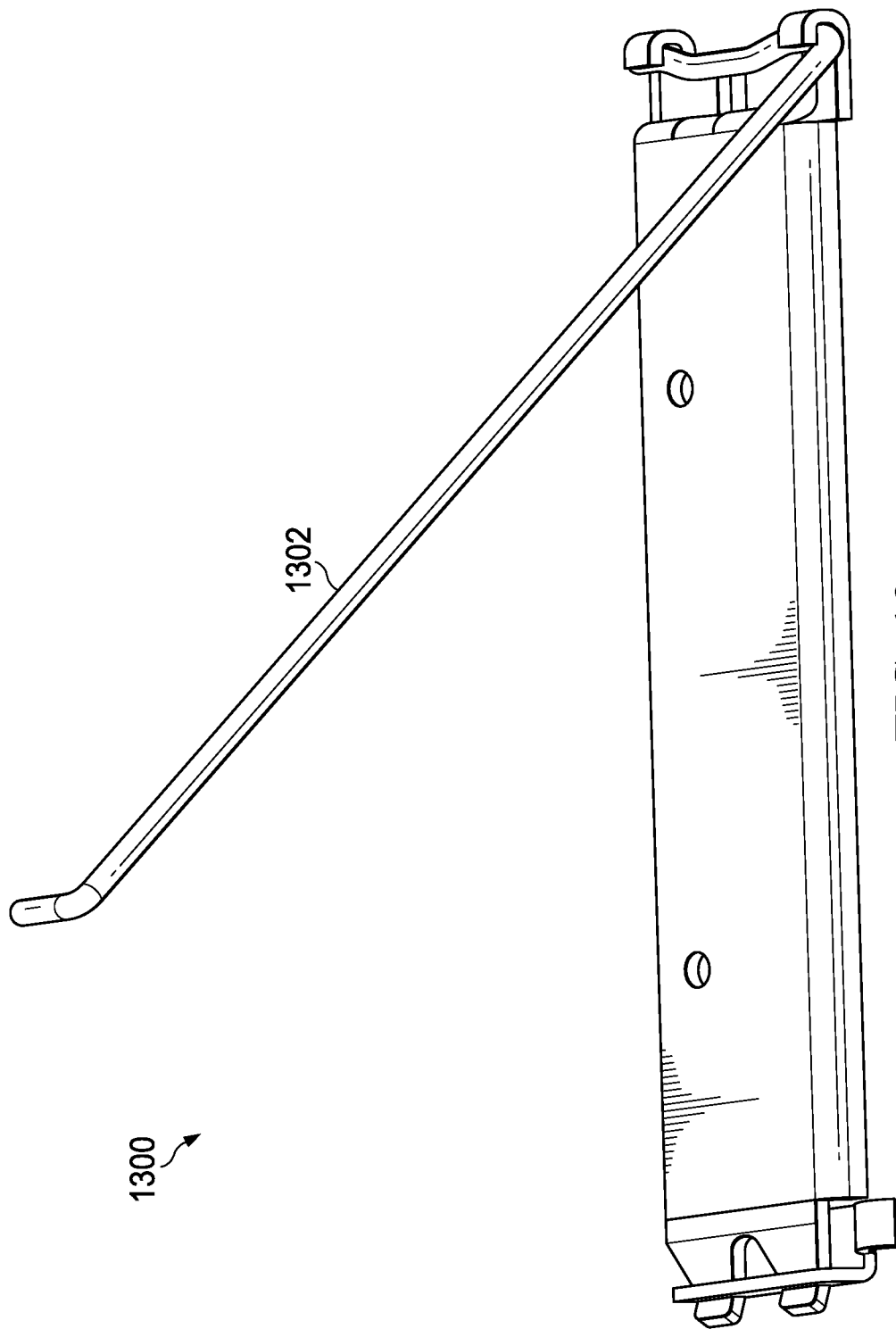
FIG. 13 is a fragmented diagrammatic top view of an alternative embodiment of a toolless installation CAMM bolster plate, according to some embodiments of the present systems and methods.
Figure 14:
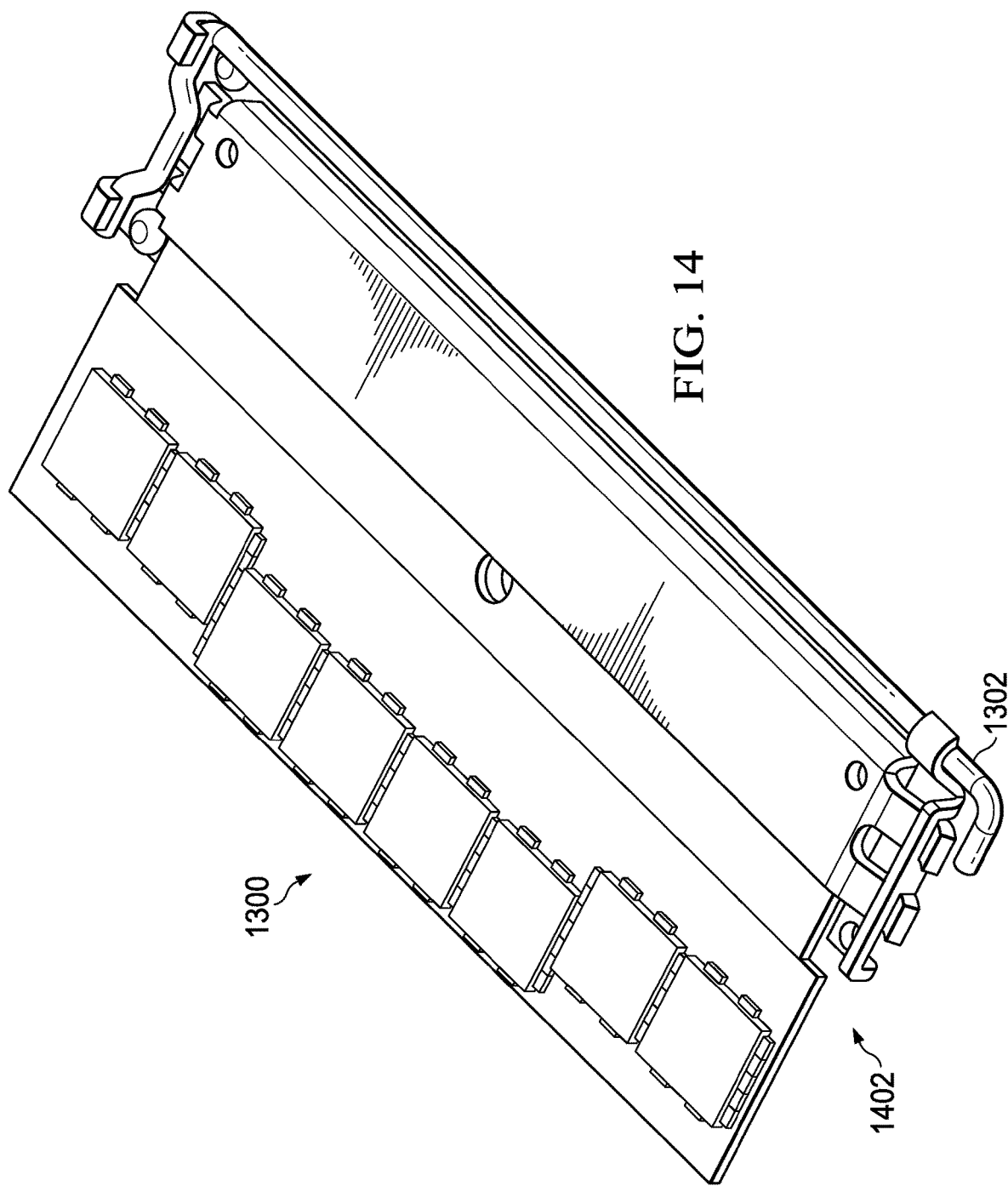
FIG. 14 is a fragmented diagrammatic top view of the alternative embodiment toolless installation CAMM bolster plate of FIG. 13, showing completed installation of a CAMM according to some embodiments of the present systems and methods.

FIG. 13 is a fragmented diagrammatic top view of alternative embodiment, toolless installation CAMM bolster plate 1300, according to some embodiments of the present systems and methods, whereas, FIG. 14 is a fragmented diagrammatic top view of alternative embodiment toolless installation CAMM bolster plate 1300 of FIG. 13, showing completed installation of CAMM 1402 according to some embodiments of the present systems and methods. Toolless installation CAMM bolster plate 1300 is a lever actuated compression device, employing lever 1302. When lever 1302 is in a locked position, toolless installation CAMM bolster plate 1300 retains CAMM 1402, as shown in FIG. 14, and when lever 1302 is in an open position, toolless installation CAMM bolster plate 1300 permits the removal of CAMM 1402, as shown in FIG. 13.

For purposes of this disclosure, an IHS may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory. Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 15:
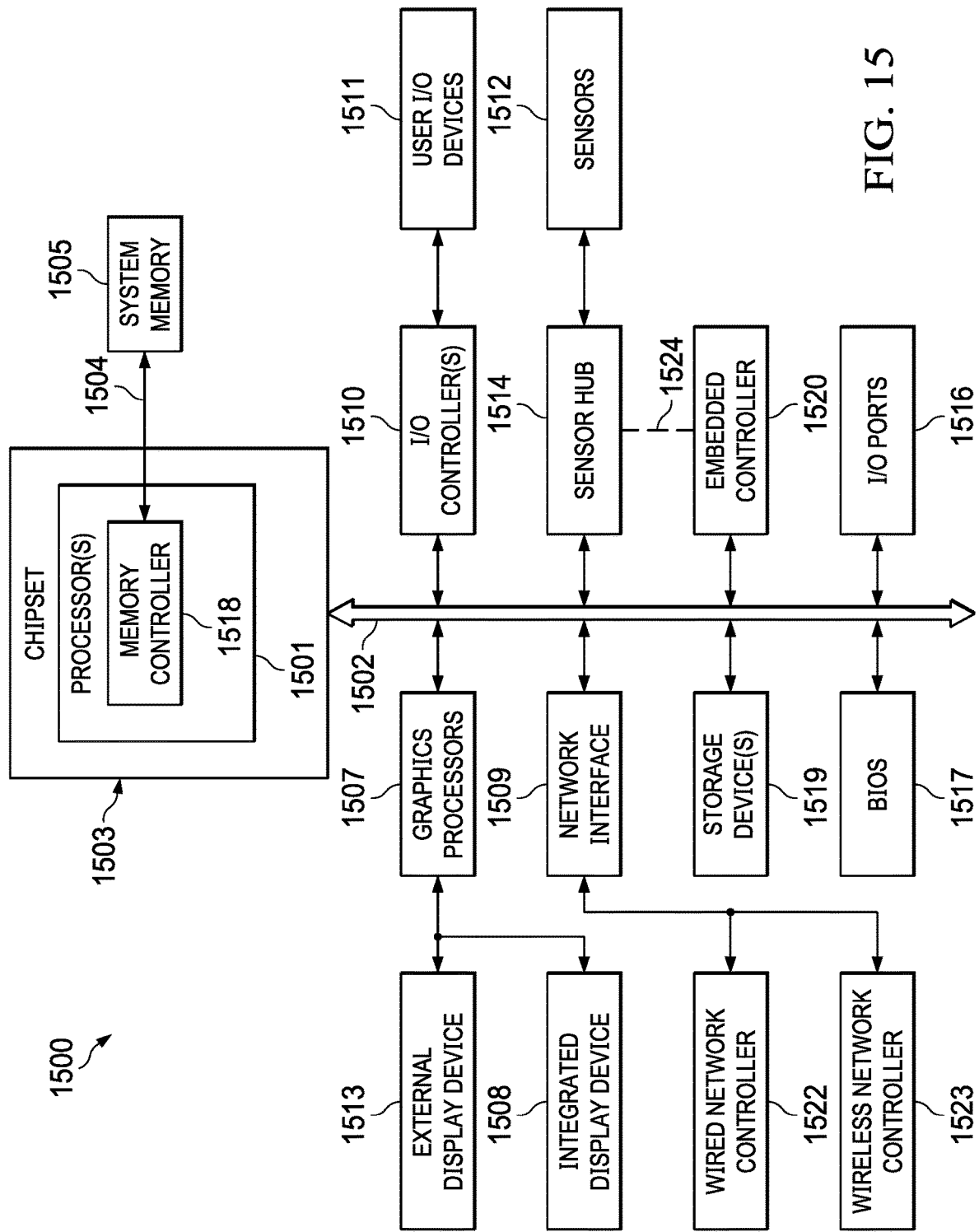
FIG. 15 is s a block diagram of an example of internal components of an IHS, according to some embodiments.

FIG. 15 is a block diagram of an example of internal components of IHS 1500, according to some embodiments. As shown, IHS 1500 includes one or more processors 1501, such as a Central Processing Unit (CPU), that execute code retrieved from system memory 1505. Although IHS 1500 is illustrated with a single processor 1501, other embodiments may include two or more processors, that may each be configured identically, or to provide specialized processing operations. Processor(s) 1501 may include any processor capable of executing instructions, such as an Intel Pentium™ series processor or any general-purpose or embedded processors implementing any of a variety of Instruction Set Architectures (ISAs), such as the x86, POWERPC®, ARM®, SPARC®, or MIPS® ISAs, or any other suitable ISA.

In the embodiment of FIG. 15, processor(s) 1501 includes memory controller 1518 that may be implemented directly within the circuitry of processor(s) 1501, or memory controller 1518 may be a separate integrated circuit that is located on the same die as processor(s) 1501. Memory controller 1518 may be configured to manage the transfer of data to and from the system memory 1505 of IHS 1500 via high-speed memory interface 1504. System memory 1505 coupled to processor(s) 1501 provides processor(s) 1501 with a high-speed memory that may be used in the execution of computer program instructions by processor(s) 1501. Accordingly, system memory 1505 may include memory components, such as static RAM (SRAM), dynamic RAM (DRAM), NAND Flash memory, suitable for supporting high-speed memory operations by processor(s) 1501. In certain embodiments, system memory 1505 may combine both persistent, non-volatile memory and volatile memory.

In certain embodiments, system memory 1505 may include multiple removable memory modules.

IHS 1500 utilizes chipset 1503 that may include one or more integrated circuits that are connected to processor(s) 1501. In the embodiment of FIG. 15, processor(s) 1501 is depicted as a component of chipset 1503. In other embodiments, all of chipset 1503, or portions of chipset 1503 may be implemented directly within the integrated circuitry of processor(s) 1501. Chipset 1503 provides processor(s) 1501 with access to a variety of resources accessible via bus 1502.

In IHS 1500, bus 1502 is illustrated as a single element. Various embodiments may utilize any number of separate buses to provide the illustrated pathways served by bus 1502.

In various embodiments, IHS 1500 may include one or more I/O ports 1516 that may support removeable couplings with various types of external devices and systems, including removeable couplings with peripheral devices that may be configured for operation by a particular user of IHS 1500. For instance, I/O 1516 ports may include USB (Universal Serial Bus) ports, by which a variety of external devices may be coupled to IHS 1500. In addition to or instead of USB ports, I/O ports 1516 may include various types of physical I/O ports that are accessible to a user via the enclosure of IHS 1500.

In certain embodiments, chipset 1503 may additionally utilize one or more I/O controllers 1510 that may each support the operation of hardware components such as user I/O devices 1511 that may include peripheral components physically coupled to I/O port 1516 and/or peripheral components that are wirelessly coupled to IHS 1500 via network interface 1509. In various implementations, I/O controller 1510 may support the operation of one or more user I/O devices 1510 such as a keyboard, mouse, touchpad, touchscreen, microphone, speakers, camera and other input and output devices that may be coupled to IHS 1500. User I/O devices 1511 may interface with an I/O controller 1510 through wired or wireless couplings supported by IHS 1500. In some cases, I/O controllers 1510 may support configurable operation of supported peripheral devices, such as user I/O devices 1511.

As illustrated, a variety of additional resources may be coupled to processor(s) 1501 of IHS 1500 through chipset 1503. For instance, chipset 1503 may be coupled to network interface 1509 that may support different types of network connectivity. IHS 1500 may also include one or more Network Interface Controllers (NICs) 1522 and 1523, each of which may implement the hardware required for communicating via a specific networking technology, such as Wi-Fi, BLUETOOTH, Ethernet and mobile cellular networks (e.g., CDMA, TDMA, LTE). Network interface 1509 may support network connections by wired network controllers 1522 and wireless network controllers 1523. Each network controller 1522 and 1523 may be coupled via various buses to chipset 1503 to support different types of network connectivity, such as the network connectivity utilized by IHS 1500.

As illustrated, IHS 1500 may support integrated display device 1508, such as a display integrated into a laptop, tablet, 2-in-1 convertible device, or mobile device. IHS 1500 may also support use of one or more external displays 1513, such as external monitors that may be coupled to IHS 1500 via various types of couplings, such as by connecting a cable from the external display 1513 to external I/O port 1516 of the IHS 1500. One or more display devices 1508 and/or 1513 coupled to IHS 1500 may utilize LCD, LED, OLED, or other display technologies. Each display device 1508 and

1513 may be capable of receiving touch inputs such as via a touch controller that may be an embedded component of display device 1508 and/or 1513 or graphics processor 1507, or it may be a separate component of IHS 1500 accessed via bus 1502. In some cases, power to graphics processor 1507, integrated display device 1508 and/or external display 1513 may be turned off or configured to operate at minimal power levels in response to IHS 1500 entering a low-power state (e.g., standby). In certain scenarios, the operation of integrated displays 1508 and external displays 1513 may be configured for a particular user. For instance, a particular user may prefer specific brightness settings that may vary the display brightness based on time of day and ambient lighting conditions. As such, chipset 1503 may provide access to one or more display device(s) 1508 and/or 1513 via graphics processor 1507. Graphics processor 1507 may be included within a video card, graphics card or within an embedded controller installed within IHS 1500. Additionally, or alternatively, graphics processor 1507 may be integrated within processor(s) 1501, such as a component of a system-on-chip (SoC). Graphics processor 1507 may generate display information and provide the generated information to one or more display device(s) 1508 and/or 1513, coupled to IHS 1500.

Chipset 1503 also provides processor(s) 1501 with access to one or more storage devices 1519. In various embodiments, storage device 1519 may be integral to IHS 1500 or may be external to IHS 1500. In certain embodiments, storage device 1519 may be accessed via a storage controller that may be an integrated component of the storage device. Storage device 1519 may be implemented using any memory technology allowing IHS 1500 to store and retrieve data. For instance, storage device 1519 may be a magnetic hard disk storage drive or a solid-state storage drive. In certain embodiments, storage device 1519 may be a system of storage devices, such as a cloud system or enterprise data management system that is accessible via network interface 1509.

As illustrated, IHS 1500 also includes Basic Input/Output System (BIOS) 1517 that may be stored in a non-volatile memory accessible by chipset 1503 via bus 1502. Upon powering or restarting IHS 1500, processor(s) 1501 may utilize BIOS 1517 instructions to initialize and test hardware components coupled to the IHS 1500. BIOS 1517 instructions may also load an operating system (OS) (e.g., WINDOWS, MACOS, iOS, ANDROID, LINUX, etc.) for use by IHS 1500. BIOS 1517 provides an abstraction layer that allows the operating system to interface with the hardware components of the IHS 1500. The Unified Extensible Firmware Interface (UEFI) was designed as a successor to BIOS. As a result, many modern IHSs utilize UEFI in addition to or instead of a BIOS. As used herein, BIOS is intended to also encompass UEFI.

As illustrated, certain IHS 1500 embodiments may utilize sensor hub 1514 capable of sampling and/or collecting data from a variety of hardware sensors 1512. Sensors may provide access to data describing environmental and operating conditions of IHS 1500 (e.g., accelerometers, gyroscopes, hinge sensors, rotation sensors, hall effect sensors, temperature sensors, voltage sensors, current sensors, IR sensors, photosensors, proximity sensors, distance sensors, magnetic sensors, microphones, ultrasonic sensors, etc.). Generally, in various implementations, processor 1501 may receive and/or produce context information using sensors 1512 including one or more of, for example: a user's presence state (e.g., present, near-field, mid-field, far-field, absent), a facial expression of the user, a direction of the user's gaze, a user's gesture, a user's voice, an IHS location (e.g., based on the location of a wireless access point or Global Positioning System), IHS movement (e.g., from an accelerometer or gyroscopic sensor), lid state (e.g., of a laptop), hinge angle (e.g., in degrees), IHS posture (e.g., laptop, tablet, book, tent, and display), whether the IHS is coupled to a dock or docking station, a distance between the user and at least one of: the IHS, the keyboard, or a display coupled to the IHS, a type of keyboard (e.g., a physical keyboard integrated into IHS 1500, a physical keyboard external to IHS 1500, or an on-screen keyboard), whether the user operating the keyboard is typing with one or two hands (e.g., holding a stylus, or the like), a time of day, software application(s) under execution in focus for receiving keyboard input, whether IHS 1500 is inside or outside of a carrying bag, ambient lighting, a battery charge level, whether IHS 1500 is operating from battery power or is plugged into an AC power source (e.g., whether the IHS is operating in AC-only mode, DC-only mode, or AC+DC mode), a power consumption of various components of IHS 1500 (e.g., CPU 1501, GPU 1507, system memory 1505, etc.), an operating temperature of components of IHS 1500, such as CPU temperature, memory module temperature, etc.

In certain embodiments, sensor hub 1514 may be an independent microcontroller or other logic unit that is coupled to the motherboard of IHS 1500. Sensor hub 1514 may be a component of an integrated system-on-chip incorporated into processor 1501, and it may communicate with chipset 1503 via a bus connection such as an Inter-Integrated Circuit (I$^2$C) bus or other suitable type of bus connection. Sensor hub 1514 may also utilize an I$^2$C bus for communicating with various sensors supported by IHS 1500.

As illustrated, IHS 1500 may utilize embedded controller (EC) 1520, which may be a motherboard component of IHS 1500 and may include one or more logic units. In certain embodiments, EC 1520 may operate from a separate power plane from the main processors 1501 and thus the OS operations of IHS 1500. Firmware instructions utilized by EC 1520 may be used to operate a secure execution system that may include operations for providing various core functions of IHS 1500, such as power management, management of operating modes in which IHS 1500 may be physically configured and support for certain integrated I/O functions. In some embodiments, EC 1520 and sensor hub 1514 may communicate via an out-of-band signaling pathway or bus 1524.

In various embodiments, IHS 1500 may not include each of the components shown in FIG. 15. Additionally, or alternatively, IHS 1500 may include various additional components in addition to those that are shown in FIG. 15. Furthermore, some components that are represented as separate components in FIG. 15 may in certain embodiments instead be integrated with other components. For example, in certain embodiments, all or a portion of the functionality provided by the illustrated components may instead be provided by components integrated into the one or more processor(s) 1501 as an SoC.

Accordingly, systems and methods described herein provide an IHS having a CPU mounted to a system PCB may employ one or more CAMMs mounting a plurality of memory devices on at least one of surface of a CAMM PCB and having an array of surface contact connections, each surface contact connection configured to be engaged with an associated contact element of a z-axis compression connector, or the like. In such embodiments at least one standoff may be affixed to, and extend, from the system PCB. Whereby, a toolless-installation top bolster plate may, in accordance with embodiments of the present systems and methods, be configured to be affixed to a surface of the CAMM PCB to provide compression between the CAMM and the z-axis compression connector. The top bolster plate may define at least one ramped keyhole, with each ramped keyhole configured to receive a head of one standoff in a wider, deep end of the ramped keyhole. The top bolster plate may be a generally flat parallelepiped body configured to contact one surface of the CAMM PCB, with a flange portion extending generally perpendicular from the body portion. This flange portion may be positioned to be disposed over an end edge of the CAMM PCB. The top bolster plate may be laterally displaced along the CAMM PCB, with the head(s) of the standoff(s) received in the deep end of the ramped keyhole, so as to engage the received head(s) of the standoff(s) with a ramped, steepening portion of the keyhole. This lateral displacement provides increasing vertical pressure to the surface of the CAMM PCB to provide compression between the CAMM and the z-axis compression connector. The toolless-installation top bolster plate may then lock in place, laterally displaced, to maintain the compression between the CAMM and the z-axis compression connector. In such an IHS, the z-axis compression connector may provide the compression, and this compression may lock the toolless-installation top bolster plate in place.

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An integral toolless-installation compression attached memory module (CAMM) bolster plate comprising a generally flat parallelepiped body portion configured to contact one surface of a printed circuit board (PCB) of a CAMM and provide compression between the CAMM and a z-axis compression connector, the bolster plate body portion defining at least one ramped keyhole, each ramped keyhole configured to receive a head of one standoff extending from an information handling system (IHS) PCB in a wider, deep end portion of the ramped keyhole and convert lateral displacement of the toolless-installation CAMM bolster plate into vertical displacement, providing the compression between the CAMM and the z-axis compression connector, by being configured to be laterally displaced along the CAMM PCB and engage the head of the one standoff with a ramp portion of the ramped keyhole sliding along a bottom face of the head of the standoff to provide increasing vertical pressure to one surface of the CAMM PCB.

2. The toolless-installation CAMM bolster plate of claim 1, wherein the integral toolless-installation CAMM bolster plate is configured to lock in place, laterally displaced, to maintain the compression between the CAMM and the z-axis compression connector.

3. The toolless-installation CAMM bolster plate of claim 1, further comprising a flange portion extending generally perpendicular from the body portion.

4. The toolless-installation CAMM bolster plate of claim 3, wherein the flange portion is positioned to be disposed over an end edge of the CAMM PCB.

5. The toolless-installation CAMM bolster plate of claim 1, wherein the bottom face of the head of the one standoff is angled at a chamfer matching a chamfer in the key-hole ramp.

6. The toolless-installation CAMM bolster plate of claim 1, further comprising a dielectric insulating material disposed on a bottom surface of the bolster plate body portion to contact the one surface of the CAMM PCB, the dielectric insulating material having a low coefficient of friction.

7. The toolless-installation CAMM bolster plate of claim 1, wherein the integral toolless-installation CAMM bolster plate is configured to:
  receive the head of each standoff through a first end of each ramped keyhole;
  be moved laterally along the CAMM PCB to engage the head of each standoff with each ramped keyhole and provide increasing vertical pressure to the one surface of the CAMM PCB to provide the compression between the CAMM and the z-axis compression connector; and lock in place with the head of each standoff maintained in a second end of each ramped keyhole, opposite the first end, to maintain the compression between the CAMM and the z-axis compression connector.

8. The toolless-installation CAMM bolster plate of claim 1, wherein:
each keyhole comprises:
sidewall portions defining a width of the keyhole sufficient to receive the head of the standoff extending from the IHS PCB, the width narrow enough to laterally retain the head of the standoff;
the deep end portion of the keyhole defined between the side wall portions and defining a shallow opening through the bolster plate body of a width sufficient to receive the head of the standoff;
the ramp portion defined between the side wall portions, extending from the deep end portion to a shallow end portion of the keyhole, defined between the side wall portions, the ramp portion defining a central slot through the bolster plate body, contiguous with the shallow opening and a deep opening defined in the shallow end portion, the slot of a width sufficient to receive a shaft of the standoff, the shaft of the standoff narrower than the head of the standoff, and the slot width narrower than the head of the standoff; and
the shallow end portion of the keyhole defining a generally flat portion defined between the side wall portions, the deep opening extending through the bolster plate body and of a width sufficient to receive the shaft of the standoff and narrower than the head of the standoff; and
the integral toolless-installation CAMM bolster plate is configured to:
receive the head of the standoff through the shallow opening; and
lock in place with the head of the standoff maintained in the shallow end portion by the generally flat portion to maintain the compression between the CAMM and the z-axis compression connector.

9. The toolless-installation CAMM bolster plate of claim 8, wherein the flat portion of the shallow end portion of each keyhole is angled obliquely away from the ramp portion to receive the head of the standoff and lock the toolless-installation CAMM bolster plate in place and maintain the compression between the CAMM and the z-axis compression connector.

10. An information handling system (IHS), comprising:
a central processing unit (CPU) mounted to a system printed circuit board (PCB);
a compression attached memory module (CAMM) comprising:
a plurality of memory devices mounted on at least one of surface of a PCB of the CAMM; and
surface contact connections, each surface contact connection configured to be engaged with an associated contact element of a z-axis compression connector;
at least one standoff affixed to, and extending, from the system PCB;
a toolless-installation top bolster plate configured to be affixed to one surface of the CAMM PCB to provide compression between the CAMM and the z-axis compression connector, the top bolster plate defining at least one ramped keyhole, each ramped keyhole configured to receive a head of one standoff in a wider, deep end of the ramped keyhole, the top bolster plate further configured to be laterally displaced along the CAMM PCB, with the head of the one standoff received in in the deep end of the ramped keyhole, to engage the received head of the one standoff with a ramp portion of the keyhole to provide increasing vertical pressure to one surface of the CAMM PCB to provide the compression between the CAMM and the z-axis compression connector.

11. The IHS of claim 10, wherein the toolless-installation top bolster plate is configured to lock in place, laterally displaced, to maintain the compression between the CAMM and the z-axis compression connector.

12. The IHS of claim 11, herein the z-axis compression connector provides the compression, and the compression locks the toolless-installation top bolster plate in place.

13. The IHS of claim 10, wherein the z-axis compression connector comprises an interposer providing spring contacts between the system PCB and the CAMM PCB.

14. The IHS of claim 10, wherein the top bolster plate further comprises a generally flat parallelepiped body portion configured to contact one surface of the CAMM PCB a flange portion extending generally perpendicular from the body portion.

15. The IHS of claim 10, wherein the flange portion is positioned to be disposed over an end edge of the CAMM PCB.

16. The IHS of claim 10, further comprising a bottom bolster plate disposed under the system PCB, the at least one standoff affixed to the bottom plate, extending, from the bottom plate through the system PCB.

17. The IHS of claim 10, wherein a bottom face of the head of each of the at least one standoffs is angled at a chamfer matching a chamfer in the key-hole ramp.

18. The IHS of claim 10, further comprising a dielectric insulating material disposed between the top bolster plate and the CAMM PCB, the dielectric insulating material having a low coefficient of friction.

19. A method for toolless installation of a compression attached memory module (CAMM) in an information handling system (IHS), the method comprising:
disposing a CAMM in the IHS with surface contact connections aligned with associated contact elements of a z-axis compression connector;
disposing a toolless-installation bolster plate on a top surface of a printed circuit board (PCB) of the CAMM, over the z-axis compression connector, in contact with the top surface of the CAMM PCB;
receiving a head of a standoff extending, from a system PCB of the IHS and through an opening in the CAMM PCB, in a first, wider, thinner end of a ramped keyhole defined in the toolless-installation bolster plate;
laterally displacing the toolless-installation bolster plate along the CAMM PCB, with the head of the standoff in the first end of the ramped keyhole, engaging the received head of the standoff with a narrower, ramp portion of the keyhole, thereby providing increasing vertical pressure to one surface of the CAMM PCB, pressing the CAMM surface contact connections into contact with the associated contact elements of the z-axis compression connector, and compressing the z-axis compression connector, providing compression between the CAMM contacts and the z-axis compression connector contacts.

20. The method of claim 19, further comprising locking the toolless-installation bolster plate in place, laterally displaced, with the head of the standoff maintained in a second, narrower, end of the ramped keyhole, opposite the first end and angled obliquely away from the ramped portion of the keyhole, whereby the compressing of the z-axis compression connector locks the toolless-installation bolster plate in place, laterally displaced, maintaining the compression of the z-axis compression connector and the compression between the CAMM contacts and the z-axis compression connector contacts.

* * * * *